United States Patent [19]
Hung

[11] Patent Number: 5,864,309
[45] Date of Patent: Jan. 26, 1999

[54] SERIAL DATA TIMING BASE MODULATOR

[75] Inventor: Chi-cheng Hung, Tainan, Taiwan

[73] Assignee: Winbond Electronics Corp., Hsinchu, Taiwan

[21] Appl. No.: 733,165

[22] Filed: Oct. 17, 1996

[51] Int. Cl.$^6$ .................................................. H03M 9/00
[52] U.S. Cl. ............................................. 341/61; 341/50
[58] Field of Search .............................. 341/50, 61, 100, 341/101

[56] References Cited

U.S. PATENT DOCUMENTS

| | | | |
|---|---|---|---|
| 4,463,421 | 7/1984 | Laws | 395/500 |
| 5,040,190 | 8/1991 | Smith et al. | 375/4 |

*Primary Examiner*—Brian K. Young
*Assistant Examiner*—Peguy Jean Pierre
*Attorney, Agent, or Firm*—Watson Cole Grindle Watson, P.L.L.C.

[57] ABSTRACT

A serial data timing base modulator includes a bidirectional data format converter, a data buffer, and a timing base generator. The bidirectional data format converter converts inputted serial data into parallel data which are then stored in a computer via the data buffer. The converted parallel data are sent to the buffer after being analyzed and emulated. The timing base generator outputs a train of timing pulses which have the same presentation speed of the original inputted serial data. The bidirectional data format converter converts the parallel data into serial data based on the timing pulses sent from the timing base generator, thus recovering the parallel data to the originally inputted serial data.

47 Claims, 5 Drawing Sheets

FIG.1A  SERIAL CLOCK SIGNAL

FIG.1B  SERIAL DATA SIGNAL

FIG.1C  WORD SELECTION SIGNAL

SERIAL DATA TIMING BASE MODULATOR

BACKGROUND OF THE INVENTION

Field of the Invention

The present invention relates to a serial data timing base modulator, especially one which can decrease the presentation speed of serial digital data, thus allowing a emulator to analyze the normal-speed digital data in a slow speed and which can increase the speed of the emulated digital data from the emulator, thus recovering the speed of the digital data to a normal speed.

Simulators used at the present time are merely for emulation of normal audio signals. Therefore, the output signal of the emulated device can be analyzed and emulated by the emulator if the frequency of the oscillation signal is adjusted to a very low value to considerably reduce the presentation speed of the output signal of the emulated device. However, for emulation of sound from data media carriers such as compact disc or video compact disc via a CD-ROM, the quick presentation speed of the sound signal prevents the emulator from analyzing and emulating the sound signal coming from the CD-ROM. Although the sound signal may be pre-recorded in a tape and reproduced in a recorder playback with a slower speed. However, the operation of the recorder playback normally introduces noises and cause worse affection to the emulation of the emulator. It is requisite to provide a serial data timing base modulator which can convert relatively high speed serial data into relatively low speed serial data and also convert relatively low speed serial data into relatively high speed serial data.

SUMMARY OF THE INVENTION

The primary objective of the present invention is to provide a new serial data timing base modulator comprising a bidirectional data format converter, a data buffer, and a timing base generator. The bidirectional data format converter converts inputted serial data into parallel data which are then stored in a computer via the data buffer. The converted parallel data are sent to the buffer after being analyzed and emulated. The timing base generator outputs a train of timing pulses which have the same presentation speed of the original inputted serial data. The bidirectional data format converter converts the parallel data into serial data based on the timing pulses sent from the timing base generator, thus recovering the parallel data to the originally inputted serial data.

Another objective of the present invention is to provide a new serial data timing base modulator comprising a bidirectional data format converter, a data buffer, and a timing base generator, wherein the bidirectional data format converter includes two shift registers for receiving the inputted serial data and converting the serial data into parallel output data, wherein the two shift registers can convert the parallel output data into the originally inputted serial data.

Another objective of the present invention is to provide a new serial data timing base modulator comprising a bidirectional data format converter, a data buffer, and a timing base generator, wherein the bidirectional data format converter comprising shift registers for converting parallel data into serial data based on timing pulses provided by the timing base generator, thereby outputting a serial data with an adjustable presentation speed.

Another objective of the present invention is to provide a new serial data timing base modulator comprising a bidirectional data format converter, a data buffer, and a timing base generator, wherein the data buffer is a bidirectional device comprising a two-port memory, an input address indicator, an output address indicator, and a read/write controller, wherein the two-port memory is separated into a plurality of memory banks for simultaneously receiving data and outputting data, thus increasing the efficiency of the read/write operation.

Another objective of the present invention is to provide a new serial data timing base modulator comprising a bidirectional data format converter, a data buffer, and a timing base generator, wherein the timing base generator comprises a phase lock loop and a voltage controlled oscillator cooperating to generate timing pulses required to recover a parallel signal to a serial signal, and a frequency divider for generating a word selection signal.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1A:
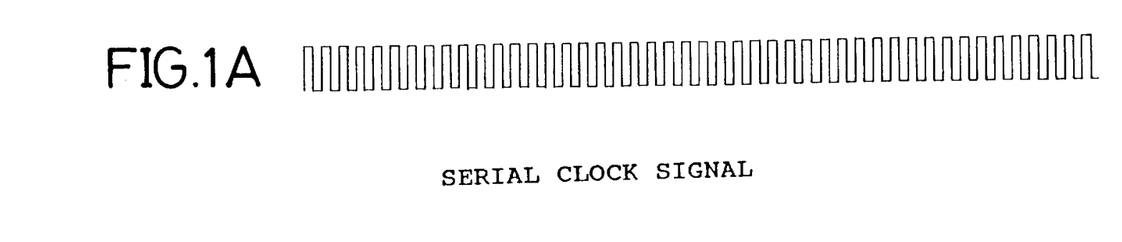
FIGS. 1A, 1B, and 1C are respectively a serial clock signal, a serial data signal, and a word selection signal for illustrating a timing relation therebetween.
Figure 1B:
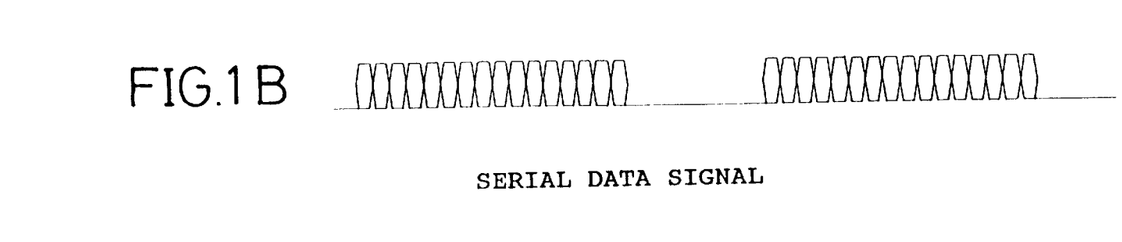
Figure 1C:
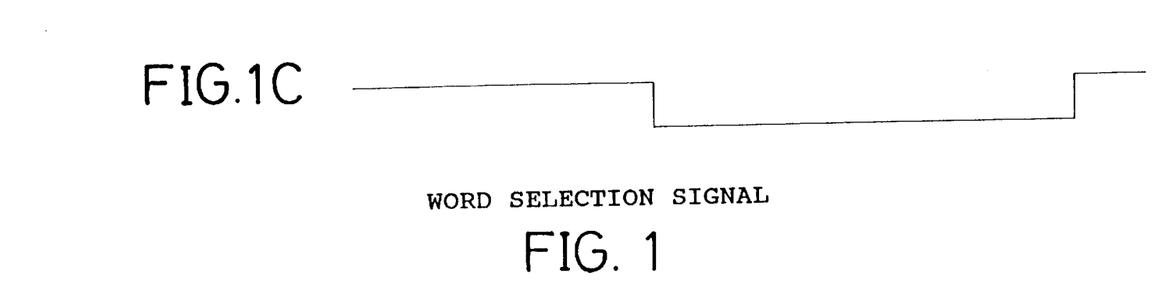

Referring to FIGS. 1A, 1B, and 1C, a serial clock signal, a serial data signal, and a word selection signal are respectively illustrated for showing a timing relation therebetween. The serial clock signal, the serial data signal, and the word selection signal together meet the specific timing requirement of the most advanced CD-DA, CD-ROM, CD-I, or MPEG. The serial data signal is synchronous to the serial clock signal. The serial data signal is defined by a plurality of words each of which is composed of sixteen data bits and separated from each other by a spacer which is defined by a plurality of invalid bits. The serial clock signal comprises a train of pulses each of which synchronously corresponds to one bit of the serial data signal. The word selection signal varies its logical level from low to high or from high to low upon the end of every word of the serial data signal. The length of each spacer of the serial data signal for a specific audio signal is specified by a corresponding format, therefore the serial data signal has to be stored when it is fetched from the signal source such as CD-DA, CD-ROM, CD-I, or MPEG. The serial clock signal and the word selection signal each have a constant frequency, therefore they are not required to be stored in a memory device during the whole operation of conversion and recovery of the serial data signal. A timing base generator generates the serial clock signal and the word selection signal in response to a recovering requirement from the serial data timing base modulator.

Moreover, the spacers intermediated between each serial data word may be filtered out during the conversion from serial data to parallel data and be added back to the serial data during the recovery operation from the parallel data to serial data for raising the efficiency of the conversion.

The respective frequencies of the serial data signal, the serial clock signal, and the word selection signal may be synchronously changed to change the presentation speed of the serial data signal.

Figure 2:
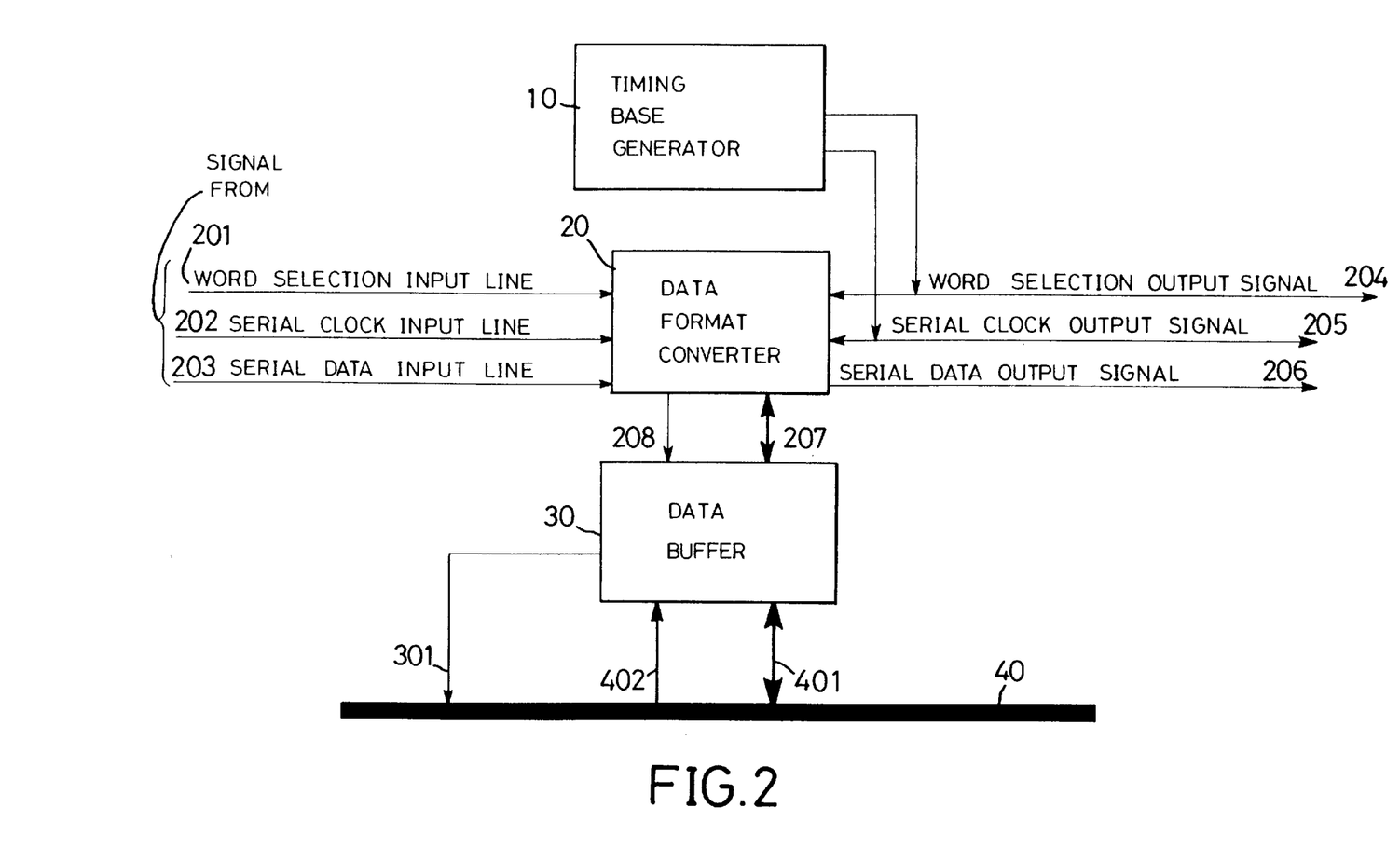
FIG. 2 is a block diagram of a serial data timing base modulator of the present invention.

Referring to FIG. 2, the serial data timing base modulator comprises a timing base generator 10, a bidirectional data format converter 20, and a bidirectional data buffer 30. The bidirectional data format converter 20 includes a word selection input line 201, a serial clock input line 202, and a serial data input line 203 for respectively receiving a word selection signal, a serial clock signal, and a serial data signal, and converting the serial data signal to a parallel data signal which is then outputted to the bidirectional buffer 30 via a parallel data bus 207 in response to a parallel data read/write signal 208. If the parallel data signal inputted to the data buffer 30 are accumulated to a predetermined amount, the data buffer 30 will output an interruption signal 301 to a central processing unit of a computer to fetch the parallel data via a public data bus 40 and send the fetched parallel data to a memory device. This memory device can store the parallel data. In other words, the inputted serial data are substantially stored in the memory device.

In contrast, when recovering the parallel data to the serial data, the data buffer 30 will send out an interruption signal 301 to the central processing unit of the computer to fetch the parallel data stored in the memory device to the data buffer 30 via the public data bus 40. The data buffer 30 will output the parallel data to the data format converter 20 upon a parallel read/write signal 208. The parallel data are converted into serial data by the data format converter 20. The timing base generator 10 outputs a word selection output signal 204 and a serial clock output signal 205 to the data format converter 20 according to a predetermined timing base which is determined by the user. The converted serial data are outputted from the data format converter 20 according to a timing base determined by the word selection output signal 204 and the serial clock output signal 205. The serial data are timingly modulated by the serial output signal 205 and the word selection output signal 204. Since the timing base generator 10 can be adjusted to vary the word selection output signal 204 and the serial clock output signal 205, the presentation speed of the converted serial data output signal may be accordingly changed.

Figure 3:
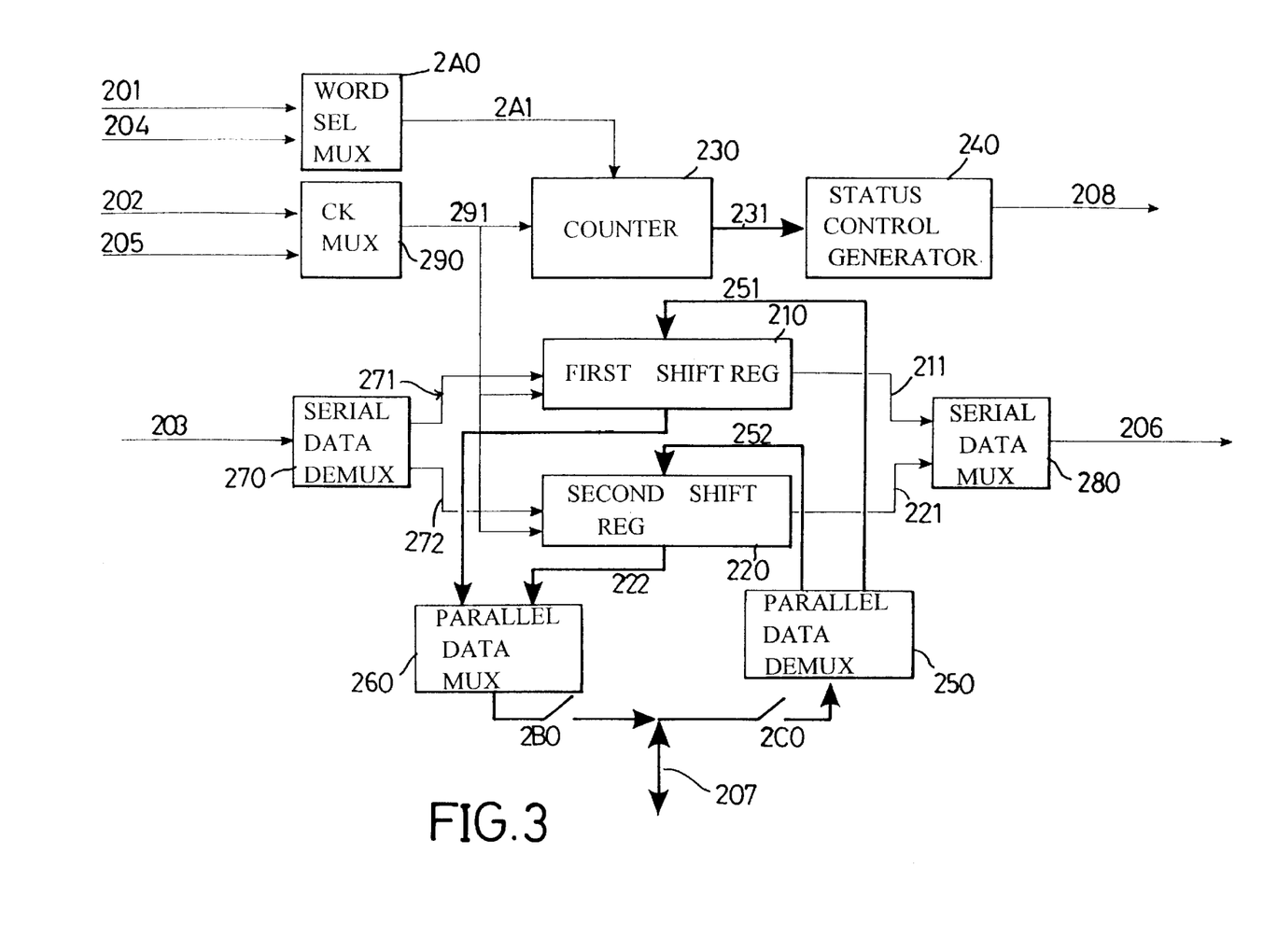
FIG. 3 is a block diagram of a data format converter incorporated in the present invention.

Referring to FIG. 3, the bi-direction data format converter 20 comprises a read/write control portion at an upper half portion thereof and a data conversion portion at a lower half portion thereof. The data conversion portion comprises two shift registers 210 and 220, each of which includes a serial data input port, a serial data output port, a parallel data input port, and a parallel data output port. A serial data demultiplexer 270 and a serial data multiplexer 280 are connected to the serial data input ports and the serial data output ports of the two registers 210 and 220 respectively. A parallel data demultiplexer 250 and a parallel data multiplexer 260 are connected to the parallel data input ports and the parallel data output ports of the two registers 210 and 220 respectively. Two switches 2B0 and 2C0 are serially connected between the parallel data demultiplexer 250 and the parallel data multiplexer 260. An interconnection between the two switches 2B0 and 2C0 is connected to the parallel data bus 207. The read/write control portion comprises a word selection multiplexer 2A0, a clock multiplexer 290, a counter 230, and a status controlling generator 240. The word selection input signal 201 and the word selection output signal 204 as mentioned previously are inputted into the word selection multiplexer 2A0. The serial clock input signal 202 and the serial clock output signal 205 as mentioned previously are inputted into the clock multiplexer 290. The clock generator 290 outputs a clock signal 291 which is counted by the counter 230 and which is used as a clock signal for each of the two registers 210 and 220. The word multiplexer 2A0 outputs a word selection signal 2A1 for resetting the counter 230. A counted value obtained from the counter 230 is fetched to the status control generator 240 which in turn outputs a parallel data read/write signal 208 for either enabling the converted parallel data to be stored in the data buffer 30 or enabling the data buffer 30 to output the parallel data to the registers 210 and 220 of the data format converter 20.

During a serial-to-parallel conversion period, the data format converter 20 receives a serial data input signal 203; the word selection multiplexer 2A0 and the clock multiplexer 290 respectively selects the word selection input signal 201 and the serial clock input signal 202 and respectively outputs the word selection signal 2A1 and the serial clock signal 291. The serial data input signal 203 is inputted to either the first register 210 or the second register 220 by control of the serial data demultiplexer 270. The parallel data multiplexer 260 is accordingly switched to one of the two registers which is receiving the serial data input signal 203. The serial data multiplexer 280 is prohibited to output data during the serial-to-parallel conversion period to avoid from outputting wrong serial data. During the serial-to-parallel conversion period, the first switch 2B0 is closed (on) while the second switch 2C0 is open (off). The two registers 210 and 220 both are set in serial-in and parallel-out mode. The selected one of the two registers 210 and 220 receives the serial data input signal bit by bit based on the timing set by the serial clock signal 291. Any level transition of the word selection signal 2A1 (from logical high level to logical low level or vice versa) indicates an end of a word of serial data. The parallel data multiplexer 260 immediately transmits the converted word of parallel data to the parallel data bus 207 via the first switch 2B0 upon an end of one word of serial data input signal 203. In the mean time, the counter 230 is reset to zero and enable the status control generator 240 to generate a parallel data read/write signal 208 which triggers the data buffer 30 to fetch the parallel data from the parallel data bus 207. In the mean time, the serial data input signal is switched by the demultiplexer 270 to another one of the two registers 210 and 220. The parallel data multiplexer 260 also switches to another one of the two registers 210 and 220 immediately after the data buffer receives the parallel data from the parallel data bus 207. The first register 210 and the second register 220 alternately receives one word of the serial data input signal 203 by control of the serial data demultiplexer 270 until the end of the serial data input signal 203. The parallel data multiplexer 260 also alternately switches between the first register 210 and the second register 220 to fetch one word of the converted parallel data. The data buffer 30 also fetches the word of converted parallel data whenever a word of serial data is converted. Therefore, this data format converter 20 can faithfully convert the serial data and stores the converted parallel data in the data buffer 230.

During a parallel-to-serial recovery period, the data format converter 20 recoveries the parallel data stored in the data buffer 230 back to serial data. During this recovery period, the word selection multiplexer 2A0 and the clock multiplexer 290 respectively selects the word selection output signal 204 and the serial clock output signal 205 and respectively outputs the word selection signal 2A1 and the serial clock signal 291. During the recovery period, the second switch 2C0 is closed (on) while the first switch 2B0 is opened (off). The parallel data demultiplexer 250 is connected to the parallel data bus 207 via the second switch 2C0. The data buffer 30 sends parallel data to the parallel data demultiplexer 250 via the parallel data bus 207 and the second switch 2C0. The two registers 210 and 220 both are set in parallel-in and serial-out mode during this recovery period. Therefore, no serial data are inputted into the two registers 210 and 220 during this recovery period. The serial data multiplex 280 selectively and alternately connected to one of the two registers 210 and 220. The serial clock signal 291 controls the registers 210 and 220 to convert parallel data into serial data. The recovered serial data are sent to the serial data multiplexer 280 which in turn sends a serial data output signal 206. Since the serial data have several invalid bits existing between each word of the serial data, the counter 230 is reset to start counting whenever the word selection signal 2A1 changes its logical level in order to result the serial data output signal 206 in proper timing. The status control generator 240 controls the data output of the registers 210 and 220 based on the counted value of the counter 230. During invalid-bit period, the serial clock signal 291 is prohibited to trigger the registers 210 and 220, thus causing the serial data output signal to generate invalid data bits. When the invalid-bit period is over, the serial clock signal 291 will trigger the registers 210 and 220 to convert parallel data into serial data and pass the converted serial data to the serial data multiplexer 280 which in turn generates serial data output signal. Any level transition of the word selection signal 2A1 indicates that a word of serial data have been outputted from the serial data multiplexer 280. In the mean time, the status control generator 240 generates a parallel data read/write signal to trigger the data buffer 30 to send out next word of parallel data to the parallel data demultiplexer 250 and the other one of the two registers 210 and 220 is selectively connected to the serial data multiplexer 280 for converting next parallel word of data to serial word of data. All the parallel data stored in the data buffer 30 are continuously transmitted to and alternately converted by the two registers 210 and 220 based on the control of the word selection output signal 204 and the serial clock output signal 205.

Figure 4:
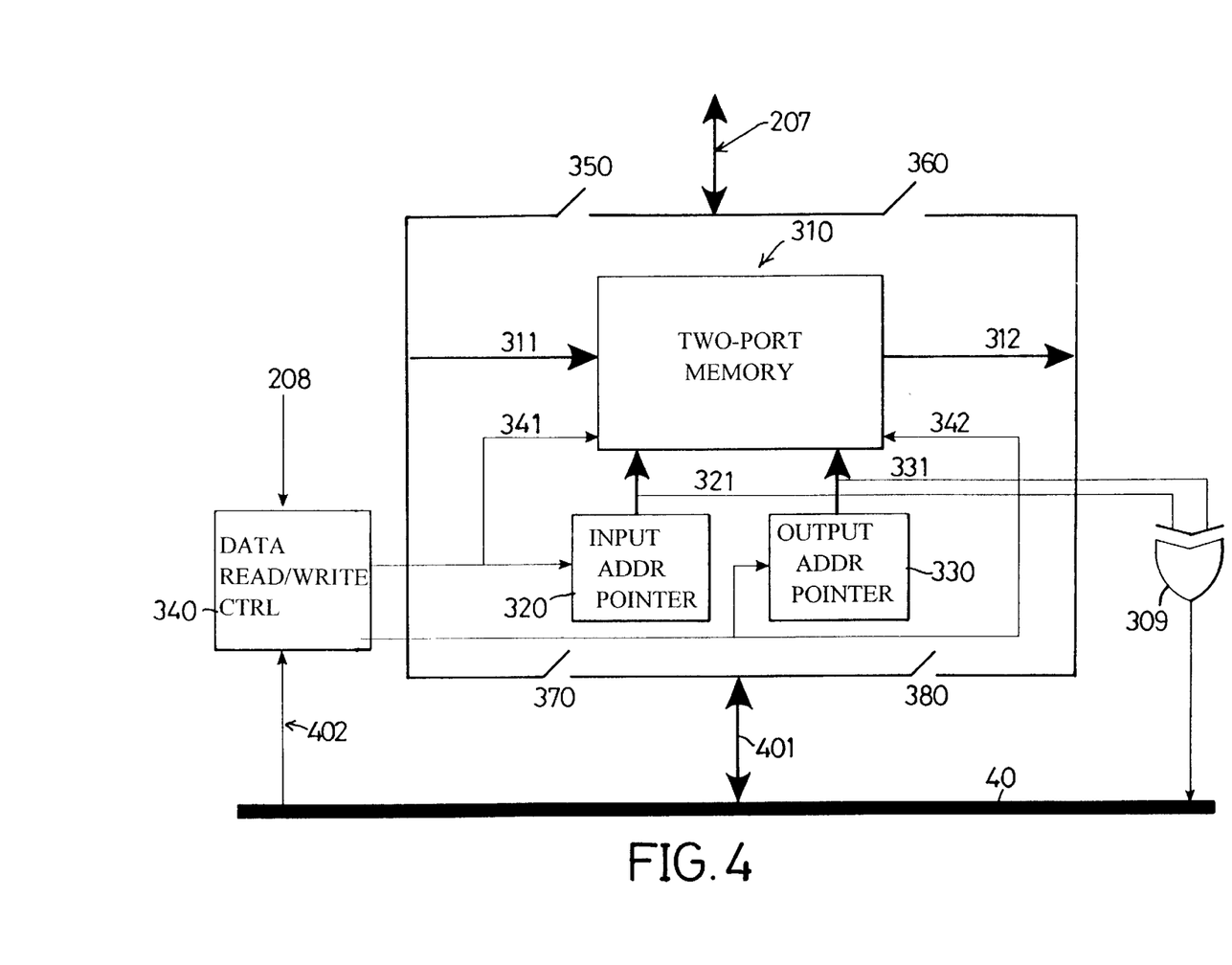
FIG. 4 is a block diagram of a data buffer incorporated in the present invention.

The processed serial data herein are real time data with periods. However, normal serial data requires longer time to be read or written than parallel data. The data buffer 30 is used for the computer to read/write economically, preventing the computer from wasting time to check the read/write of the data. FIG. 4 illustrates the block diagram of the data buffer 30. The data buffer 30 comprises a two-port memory 310, an input address pointer 320, and an output address pointer 330. The two address pointers 320 and 330 are basically data counters. The read/writer function of the two-port memory 310 is controlled by a data read/write controller 340. A plurality of switches 350, 360, 370, and 380 are used to control the input and the output of the two-port memory 310. The data buffer 30 is read/written by a CPU of the computer upon an interruption requirement. The memory capacity of the of the two-port memory 310 is required to be $2^n$. The highest bit of the address pointers can be used to distinguish two memory banks. An interruption signal representing the interruption requirement is determined by an exclusive or function of the two highest bits of the two address pointers 320 and 330.

When recording data, the parallel data bus 207 is connected to an input terminal 311 of the two-port memory 310 via the switch 350, and the public data bus 40 is connected to an output terminal 312 of the two-port memory 310 via a switch 380. The two switches 360 and 370 are opened. Upon commencement of the recording, the data format converter will output a word write signal 341 when it receives parallel data. The write signal 341 enables the parallel data in the parallel data bus 207 to be written into the two-port memory 310, and causes the input address pointer 320 to point to next address. Since every time the write signal 341 causes the pointed value of the input address pointer 320 to increase, the highest bit of the input address pointer 320 will finally change its logical value. During this recording period the output address pointer 330 does not function except that when the computer is interrupted by the interruption signal, the computer continuously reads data from the data buffer 30 causing the output address pointer 330 to increase its pointed value until the highest bit is changed. When the input address pointer 320 and the output address pointer 330 both point to a same bank of the two-port memory 310, the output of the exclusive OR gate 390 is logical zero which represents that the interruption signal is inactive. When the highest bit of the input address pointer 320 changes, one of the banks of the two-port memory 310 is full. In this situation, the input address pointer 320 and the output address pointer 330 respectively point to different banks of the two-port memory 310. The output of the exclusive OR gate 390 changes from logical zero to logical one which represents that the interruption signal is active and enable the computer to execute an interruption routine to continuously read data from the two-port memory 310 until the highest bit of the output address pointer 330 changes its logical status. Herein, to read data from a bank of the two-port memory 310 is faster than to write data into the bank, therefore, no data will be overwritten unless they have been read previously.

When recovering the data, the parallel data bus 207 is connected to the data output terminal 312 of the two-port memory 310 via the switch 360, and the public data bus 40 is connected to the data input terminal 311 of the two-port memory 310 via the switch 370. The switches 350 and 380 are opened. The two banks of the two-port memory 310 are filled with data before recovering data. The data format converter 20 outputs a word read/write signal 208. The data read/write controller 340 generates a read memory signal 342 upon receiving the word read/write signal 208. The read memory signal 342 enables the data in the parallel data bus 207 (the data is originally fetched from the two-port memory 310) to be written into the data format converter 20, and triggers the output address pointer 330 to point to next address (the pointed value is increased). Every read memory signal 342 will enable the output address pointer 330 to increase its pointed value, and finally the highest bit of the output address pointer 330 changes its logical value. During this recovering period, the input address pointer 320 does not function except that when the computer is interrupted by the interruption signal, the computer continuously writes data into the data buffer 30 causing the input address pointer 320 to increase its pointed value until the highest bit is changed. When the input address pointer 320 and the output address pointer 330 both point to a same bank of the two-port memory 310, the output of the exclusive OR gate 390 is logical zero which represents that the interruption signal is inactive. When the highest bit of the output address pointer 330 changes, one of the banks of the two-port memory 310 is read throughout. In this situation, what the input address pointer 320 points lags a bank behind the output address pointer 330 points. The output of the exclusive OR gate 390 changes from logical zero to logical one which represents that the interruption signal is active and it enables the computer to execute an interruption routine to continuously write data into the bank which has been just read until the highest bit of the input address pointer 320 changes its logical status. Herein, reading data from a bank of the two-port memory 310 is prior to writing data into the bank, therefore, no data will be overwritten unless they have been read previously.

Figure 5:
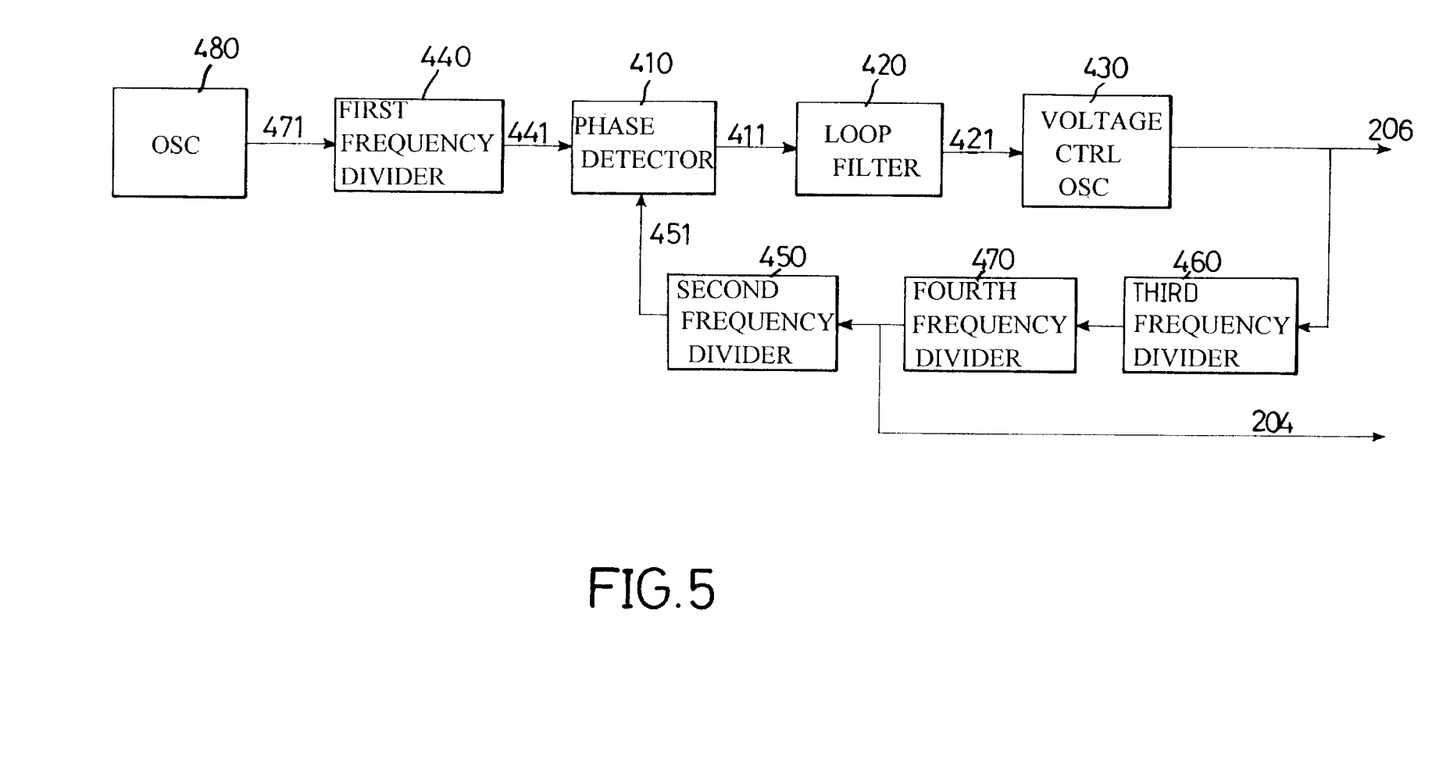
FIG. 5 is a block diagram of a timing base generator incorporated in the present invention.

The device of the present invention merely records the serial data during recording period, therefore, it has to additionally generates serial clock signal and word selection signal during the recovering period. The timing base generator 10 is used to generate the required serial clock signal and the word selection signal. The periods of the serial clock signal and the word selection signal are adjustable by the requirement of the user. A block diagram of the timing base generator 10 is illustrated in FIG. 5. The timing base generator 10 is basically a phase lock loop which includes an oscillator 480, a phase detector 410, a loop filter 420, a voltage-controlled frequency oscillator 430, and a first frequency divider 440, a second frequency divider 450, a third frequency divider 460, and a fourth frequency divider 470. The oscillator 480 is connected to the first frequency divider 440, which is connected to the phase detector 410, which is connected to the loop filter 420, which is connected to the voltage controlled oscillator 430, which is connected to the third frequency divider 460, which is connected to the fourth frequency divider 470, which is connected to the second frequency divider 450, which is connected to the phase detector 410, as shown in FIG. 5. Normally, a simple phase lock loop merely uses a frequency divider. However, this invention utilizes four frequency dividers. A first frequency divider 440 and a second frequency divider 450 are used to set a sampling frequency of the serial data output. A third frequency divider 460 is used to set the clock number for each word of serial data which includes the valid bits and the invalid bits of each word. The required serial clock signal and the word selection signal can be determined by the three frequency dividers 440, 450, and 460. The oscillator 480 generates a basic clock signal with frequency of X Hertz to the first frequency divider 440. Suppose the first frequency divider 440, the second frequency divider 450, and the third frequency divider 460 are respectively divided by A, B, and C, where A, B, and C are positive integers. According to the function theory of a phase lock loop, the serial clock output signal has a frequency as following:

$$2BCX/A$$

The word selection output signal will have a frequency as following:

$$2BX/A$$

The fourth frequency divider 470 is divided by 2 in order to let the word selection output signal 204 have a symmetric square wave which may also be a selection signal of left and right audio channels. Therefore, the frequencies of the serial clock output signal and the word selection output signal can be accordingly adjusted by adjusting the divided values A, B, and C of the three frequency dividers 440, 450, and 460. The data recovering (from parallel data to serial data) speed, i.e., the presenting speed of the converted serial data, is accordingly adjusted by adjusting the divided values A, B, and C of the three frequency dividers 440, 450, and 460.

Actually, the data buffer 30 is merely a data transferring medium which can be omitted according to practical use. The serial clock output signal 205 and the word selection signal 204 are merely for use of controlling read/write of data and they are not stored in any device. The presentation speed of the recovered serial data is determined by the serial clock output signal 205 and the word selection output signal 204 whose frequencies are adjustable by the three frequency dividers 440, 450, and 460 of timing base generator 10. Since the serial clock signal and the word selection signal are not required to be stored, the serial data timing base modulator can save storing space of memories thus reducing cost.

I claim:

1. A serial data timing base modulator comprising:

a data format converter comprising a serial data input port, a serial data output port, and a bidirectional parallel data bus, for converting inputted serial data into parallel data which are outputted from the bidirectional parallel data bus, and for recovering parallel data inputted from the bidirectional parallel data bus into serial data which are then outputted from the serial data output port in a parallel-in/serial-out mode, said data formal converter further comprising a first shift register being capable of converting serial data into parallel data or converting parallel data into serial data depending in which mode said data format converter is, and a read/write control including a word selection multiplexer for selectively switching to receive one of a word selection input signal and a word selection output signal, whereby the word selection input signal is selected by the word selection multiplexer when converting serial data into parallel data, and whereby the word selection output signal is selected by the word selection multiplexer when recovering the converted parallel data to serial data, and a clock multiplexer for selectively switching to receive one of a serial clock input signal and a serial clock output signal, whereby the serial clock input signal is selected by the clock multiplexer where receiving the serial data, and whereby the serial clock output signal is selected by the clock multiplexer when recovering the converted parallel data to serial data;

a timing base generator for generating a frequency-adjustable serial clock signal and a frequency-adjustable word selection signal in a parallel-in/serial-out mode to the data format converter for controlling a presentation speed of the recovered serial data.

2. The serial data timing base modulator as claimed in claim 1 further comprising a bidirectional data buffer connected between the data format converter and a public data bus from computer for temporarily storing the converted parallel data.

3. The serial data timing base modulator as claimed in claim 1 wherein the data format converter comprises a word selection input terminal and a serial clock input terminal for respectively outputting the word selection signal and the serial clock output signal.

4. The serial data timing base modulator as claimed in claim 1 wherein the data format converter comprises a read/write control loop and a data conversion loop.

5. The serial data timing base modulator as claimed in claim 4 wherein the read/write control loop comprises:

a counter for counting the serial clock input signal and outputting a counted output signal, the counter being reset by the word selection signal when the word selection signal is transited from a logical status to an opposite logical status; and a status control generator for receiving the counted output signal and generating a read/write signal to inform an external loop of executing reading/writing data when the counter is reset.

6. The serial data timing base modulator as claimed in claim 5 wherein the read/write control loop comprises:

a word selection multiplexer for selectively switching to receive one of a word selection input signal and a word selection output signal, whereby the word selection input signal is selected by the word selection multiplexer when converting serial data into parallel data, and whereby the word selection output signal is selected by the word selection multiplexer when recovering the converted parallel data to serial data; and a clock multiplexer for selectively switching to receive one of a serial clock input signal and a serial clock output signal, whereby the serial clock input signal is selected by the clock multiplexer when receiving the serial data, and whereby the serial clock output signal is selected by the clock multiplexer when recovering the converted parallel data to serial data.

7. The serial data timing base modulator as claimed in claim 4 wherein the data conversion loop comprises a first shift register for converting serial data into parallel data or converting parallel data into serial data, which comprises a serial data input terminal for receiving a serial data input signal, a serial data output terminal for outputting a serial data output signal, a parallel data input port for receiving parallel data, and a parallel data output port for outputting parallel data therefrom.

8. The serial data timing base modulator as claimed in claim 7 further comprises a second shift register identical to the first shift register thus the first shift register and the second shift register can alternately receive serial data input signal word by word and alternately convert serial data word into parallel data word.

9. The serial data timing base modulator as claimed in claim 8 further comprises a serial data demultiplexer for alternately switching the serial data input signal to the first shift register and the second shift register.

10. The serial data timing base modulator as claimed in claim 8 further comprising a serial data multiplexer connected to respective serial data output terminals of the first shift register and the second shift register for alternately transfer the recovered serial data from the first shift register and the second shift register.

11. The serial data timing base modulator as claimed in claim 8 further comprising a parallel data demultiplexer connected to the parallel data input ports of the first shift register and the second shift register for alternately transfers parallel data from the data buffer to the two shift registers, and a parallel data multiplexer connected to the parallel data output ports of the first shift register and the second shift register for alternately transferring parallel data converted by the two shift registers to the data buffer.

12. The serial data timing base modulator as claimed in claim 11 further comprising a first switch connected between the parallel data multiplexer and the parallel data bus and a second switch connected between the parallel data demultiplexer and the parallel data bus, whereby the first switch is closed and the second switch is opened when converting serial data to parallel data, and whereby the first switch is opened and the second switch is closed when recovering parallel data to serial data.

13. The serial data timing base modulator as claimed in claim 1 wherein the timing base generator is composed of a phase lock loop.

14. The serial data timing base modulator as claimed in claim 1 wherein the timing base generator comprises a phase lock loop which comprises a frequency divider.

15. The serial data timing base modulator as claimed in claim 1 wherein the timing base generator comprises a phase lock loop which comprises a plurality of frequency dividers.

16. The serial data timing base modulator as claimed in claim 14 wherein the divisor of the frequency divider is so adjustable that the frequencies of the serial clock output signal and the word selection output signal are adjustable.

17. The serial data timing base modulator as claimed in claim 15 wherein the divisors of the frequency dividers are so adjustable that the frequencies of the serial clock output signal and the word selection output signal are adjustable.

18. The serial data timing base modulator as claimed in claim 14 wherein the word selection signal is outputted from an output terminal of the frequency divider.

19. The serial data timing base modulator as claimed in claim 15 wherein the word selection signal is outputted from an output terminal of one of the frequency dividers.

20. The serial data timing base modulator as claimed in claim 19 wherein the frequency divider outputting the word selection signal is a divided by two frequency divider for sending symmetric square wave for the word selection signal.

21. The serial data timing base modulator as claimed in claim 15 wherein the bidirectional data buffer includes a two-port memory.

22. The serial data timing base modulator as claimed in claim 15 wherein the bidirectional data buffer further comprises:

a data read/write controller for controlling read/write of the tow-port memory according to the read/write signal sent from the data format converter;

an input address pointer connected to input address lines of the two-port memory for indicating the address of the two-port memory being written data thereinto;

an output address pointer connected to output address lines of the two-port memory for indicating the address of the two-port memory being read data therefrom;

a plurality of switches connected between the parallel data bus of the data format converter, the input port and output port of the two-port memory, and a public data bus from a computer for determining data path direction.

23. The serial data timing base modulator as claimed in claim 22 further comprising an exclusive OR gate connected to the input address pointer and the output address pointer for outputting an interruption signal to interrupt the computer.

24. The serial data timing base modulator as claimed in claim 23 wherein the input address pointer and the output address pointer are respectively connected to the exclusive OR gate by their highest.

25. A serial data timing base modulator comprising:

a data format converter comprising a serial data input port, a serial data output port, and a bidirectional parallel data bus, for converting inputted serial data into parallel data which are outputted from the bidirectional data bus in a serial-in/parallel-out mode, and for recovering parallel data inputted from the bidirectional parallel data bus into serial data which are then outputted from the serial data output port in a parallel-in/serial-out mode, said data format converter further comprising a first shift register being capable of converting serial data into parallel data or converting parallel data into serial data depending in which mode said data format converter is, and a read/write control including a word selection multiplexer for selectively switching to receive one of a work selection input signal and a word selection output signal, whereby the word selection input signal is selected by the word selection multiplexer when converting serial data into parallel data, and whereby the word selection output signal is selected by the word selection multiplexer when recovering the converted parallel data to serial data, and a clock multiplexer for selectively switching to receive one of a serial clock input signal and a serial clock output signal, whereby the serial clock input signal is selected by the clock multiplexer when receiving the serial data, and whereby the serial clock output signal is selected by the clock multiplexer when recovering the converted parallel data to serial data; and a bidirectional data buffer connected between the data format converter and a computer data bus for temporarily storing the converted parallel data;

a timing base generator for generating a frequency-adjustable serial clock signal and a frequency-adjustable word selection signal in a parallel-in/serial-out mode to the data format converter for controlling a presentation speed of the recovered serial data.

26. The serial data timing base modulator as claimed in claim 25 wherein the data format converter comprises a word selection input terminal and a serial clock input terminal for respectively outputting the word selection signal and the serial clock output signal.

27. The serial data timing base modulator as claimed in claim 25 wherein the data format converter comprises a read/write control loop and a data conversion loop.

28. The serial data timing base modulator as claimed in claim 27 wherein the read/write control loop comprises:
 a counter for counting the serial clock input signal and outputting a counted output signal, the counter being reset by the word selection signal when the word selection signal is transited from a logical status to an opposite logical status; and
 a status control generator for receiving the counted output signal and generating a read/write signal to inform an external loop of executing reading/writing data when the counter is reset.

29. The serial data timing base modulator as claimed in claim 28 wherein the read/write control loop comprises:
 a word selection multiplexer for selectively switching to receive one of a word selection input signal and a word selection output signal, whereby the word selection input signal is selected by the word selection multiplexer when converting serial data into parallel data, and whereby the word selection output signal is selected by the word selection multiplexer when recovering the converted parallel data to serial data; and
 a clock multiplexer for selectively switching to receive one of a serial clock input signal and a serial clock output signal, whereby the serial clock input signal is selected by the clock multiplexer when receiving the serial data, and whereby the serial clock output signal is selected by the clock multiplexer when recovering the converted parallel data to serial data.

30. The serial data timing base modulator as claimed in claim 27 wherein the data conversion loop comprises a first shift register for converting serial data into parallel data or converting parallel data into serial data, which comprises a serial data input terminal for receiving a serial data input signal, a serial data output terminal for outputting a serial data output signal, a parallel data input port for receiving parallel data, and a parallel data output port for outputting parallel data therefrom.

31. The serial data timing base modulator as claimed in claim 30 further comprises a second shift register identical to the first shift register thus the first shift register and the second shift register can alternately receive serial data input signal word by word and alternately convert serial data word into parallel data word.

32. The serial data timing base modulator as claimed in claim 31 further comprises a serial data demultiplexer for alternately switching the serial data input signal to the first shift register and the second shift register.

33. The serial data timing base modulator as claimed in claim 31 further comprising a serial data multiplexer connected to respective serial data output terminals of the first shift register and the second shift register for alternately transfer the recovered serial data from the first shift register and the second shift register.

34. The serial data timing base modulator as claimed in claim 31 further comprising a parallel data demultiplexer connected to the parallel data input ports of the first shift register and the second shift register for alternately transfers parallel data from the data buffer to the two shift registers, and a parallel data multiplexer connected to the parallel data output ports of the first shift register and the second shift register for alternately transferring parallel data converted by the two shift registers to the data buffer.

35. The serial data timing base modulator as claimed in claim 34 further comprising a first switch connected between the parallel data multiplexer and the parallel data bus and a second switch connected between the parallel data demultiplexer and the parallel data bus, whereby the first switch is closed and the second switch is opened when converting serial data to parallel data, and whereby the first switch is opened and the second switch is closed when recovering parallel data to serial data.

36. The serial data timing base modulator as claimed in claim 25 wherein the timing base generator is composed of a phase lock loop.

37. The serial data timing base modulator as claimed in claim 25 wherein the timing base generator comprises a phase lock loop which comprises a frequency divider.

38. The serial data timing base modulator as claimed in claim 37 wherein the divisor of the frequency divider is so adjustable that the frequencies of the serial clock output signal and the word selection output signal are adjustable.

39. The serial data timing base modulator as claimed in claim 37 wherein the word selection signal is outputted from an output terminal of the frequency divider.

40. The serial data timing base modulator as claimed in claim 39 wherein the frequency divider outputting the word selection signal is a divided by two frequency divider for sending symmetric square wave for the word selection signal.

41. The serial data timing base modulator as claimed in claim 25 wherein the timing base generator comprises a phase lock loop which comprises a plurality of frequency dividers.

42. The serial data timing base modulator as claimed in claim 41 wherein the divisors of the frequency dividers are so adjustable that the frequencies of the serial clock output signal and the word selection output signal are adjustable.

43. The serial data timing base modulator as claimed in claim 41 wherein the word selection signal is outputted from an output terminal of one of the frequency dividers.

44. The serial data timing base modulator as claimed in claim 25 wherein the bidirectional data buffer includes a two-port memory.

45. The serial data timing base modulator as claimed in claim 44 wherein the bidirectional data buffer further comprises:

a data read/write controller for controlling read/write of the tow-port memory according to the read/write signal sent from the data format converter;

an input address pointer connected to input address lines of the two-port memory for indicating the address of the two-port memory being written data thereinto;

an output address pointer connected to output address lines of the two-port memory for indicating the address of the two-port memory being read data therefrom;

a plurality of switches connected between the parallel data bus of the data format converter, the input port and output port of the two-port memory, and a public data bus from a computer for determining data path direction.

46. The serial data timing base modulator as claimed in claim 45 further comprising an exclusive OR gate connected to the input address pointer and the output address pointer for outputting an interruption signal to interrupt the computer.

47. The serial data timing base modulator as claimed in claim 46 wherein the input address pointer and the output address pointer are respectively connected to the exclusive OR gate by their highest address bits.

* * * * *